United States Patent
Iwabuchi et al.

(10) Patent No.: US 7,126,342 B2
(45) Date of Patent: Oct. 24, 2006

(54) VOLTAGE MEASUREMENT DEVICE

(75) Inventors: Akio Iwabuchi, Niiza (JP); Masaki Kanazawa, Niiza (JP); Kazuya Aizawa, Niiza (JP); Norimasa Yamada, Niiza (JP); Toshiaki Ariyoshi, Wako (JP); Takafumi Tsurumi, Wako (JP); Yoshikazu Nomoto, Wako (JP)

(73) Assignees: Sanken Electric Co., Ltd., Saitama (JP); Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 10/549,870

(22) PCT Filed: Mar. 23, 2004

(86) PCT No.: PCT/JP2004/003944

§ 371 (c)(1),
(2), (4) Date: Sep. 21, 2005

(87) PCT Pub. No.: WO2004/086065

PCT Pub. Date: Oct. 7, 2004

(65) Prior Publication Data

US 2006/0186894 A1 Aug. 24, 2006

(30) Foreign Application Priority Data

Mar. 24, 2003 (JP) .............................. 2003-080406

(51) Int. Cl.
*G01N 27/416* (2006.01)
*H02J 7/00* (2006.01)

(52) U.S. Cl. ..................... 324/426; 320/116; 320/121

(58) Field of Classification Search ................ 324/426, 324/429; 320/116, 121
See application file for complete search history.

(56) References Cited

U.S. PATENT DOCUMENTS

| 6,020,717 A | 2/2000 | Kadouchi et al. |
| 6,362,626 B1* | 3/2002 | Furukawa .................... 324/429 |
| 6,362,627 B1 | 3/2002 | Shimamoto et al. |
| 6,407,534 B1* | 6/2002 | Mukainakano .............. 320/162 |
| 6,437,538 B1 | 8/2002 | Tsurumi et al. |
| 6,541,980 B1* | 4/2003 | Maki .......................... 324/426 |

FOREIGN PATENT DOCUMENTS

| JP | 61-125700 | 6/1986 |
| JP | 06-061813 | 3/1994 |
| JP | 09-001617 | 1/1997 |
| JP | 2001-116777 | 4/2001 |

* cited by examiner

Primary Examiner—Anjan Deb
Assistant Examiner—Amy He
(74) Attorney, Agent, or Firm—Brenda O. Holmes; Kilpatrick Stockton LLP (57) ABSTRACT

A voltage measurement device includes a first group of switches Q1, Q2, a second group of switches Q7, Q8 and a third groups of switches Q5, Q6. By turning on the third group of switches Q5, Q6, the first group of switches Q1, Q2 are turned on, so that a condenser C1 is charged by voltage impressed between a voltage input terminal A and a voltage input terminal B. While the first group of switches Q1, Q2 are turned off by tuning off the third group of switches Q5, Q6, the second group of switches Q7, Q8 are turned on, so that voltage retained in the condenser C1 is generated between a voltage output terminal G and a voltage output terminal H.

11 Claims, 8 Drawing Sheets

VOLTAGE MEASUREMENT DEVICE

TECHNICAL FIELD

The present invention relates to a voltage measurement device for measuring voltage of a voltage source, particularly, to a technique for improving the measuring accuracy.

BACKGORUND OF ART

In prior art, there is known an electric car having a motor as a driving source for running the car or a hybrid vehicle having a motor and an engine, from a point of view of environmental protection.

It's often the case that hundreds of storage batteries or fuel batteries (which will be generally referred to as "batteries" below) connected in series are used for a power source for driving these motors. Recently, the need to measure a terminal voltage of approx. 1 V of respective battery cells each having hundreds of voltage impressed as a result of series connection with high accuracy is increasing in order to monitor the ever-changing charging state of the battery during traveling, the ever-changing discharging state, lifetime of respective batteries, the presence of a malfunction and so on.

In order to reply such a requirement, according to the technique disclosed in Japanese Patent Laid-Open Publication No. 2001-116777, the measurement of the terminal voltage of the battery is carried out by forming a module with respect to several battery cells forming the battery collectively, charging voltage of the respective modules into condenser elements through a first group of switches and, after switching off the first group of switches, connecting the condenser elements to a voltage measurement device through a second group of switches.

In the above technique, a photo MOSFET or the equivalent element is used as a switching element. Thus, it is easy to separate a switch driving signage from a measurement voltage signage. Also, a switch driving signal is less subjected to a measurement voltage signal. Therefore, the above technique has advantages of eliminating any contrivance for a switch driving circuit.

DISCLOSURE OF THE INVENTION

However, the above-mentioned technique has the following problems.

(1) Since the reaction velocity of a photo MOSFET is slow and varies widely, it is necessary to switch respective switches on the safe side, causing a difficulty to perform the switching operation of the condenser elements between charging and discharging accurately and rapidly.

(2) As the structure of a photo MOSFET has difficulties for miniaturization and high-integration, a measurement device is large-sized and expensive.

(3) A power source for driving a photo MOSFET is necessary. If the number of measuring positions increases, then a large current is required.

(4) When measuring voltage of a fuel battery having a working temperature higher than that of an accumulator battery, it is necessary to allow an operation temperature of a circuit of the measurement device to withstand very high temperatures. Nevertheless, it is difficult to form a photo MOSFET so as to withstand very high temperatures.

(5) Respective switches are provided with no protective function. Therefore, even if a circuit is designed so that a short-circuit current does not flow by acquiring sufficient time to respective switching time of the switches, a malfunction of driving signals by large noise from a motor or an engine would cause the respective switches to be operated erroneously, so that a short-circuit current does flow to have a damaging effect on a voltage measurement circuit.

In order to solve the above-mentioned problems, an object of the present invention is to provide a small-sized and low-cost voltage measurement device which is excellent in the noise resistant capability and which allows a terminal voltage of a battery cell to be measured at a high speed and with high accuracy without requiring a special power source.

In a voltage measurement device for dividing a plurality of voltage sources into a plurality of blocks each having at least one voltage source and for measuring voltage of each of the blocks, according to the main aspect of the present invention, the voltage measurement device is characterized by comprising: a first group of switches including a first MOSFET of a first conductivity type, which has a first main electrode connected to a first voltage input terminal connected to one terminal of a block and which is turned ON/OFF in correspondence with voltage impressed on a control electrode based on voltage impressed on the first main electrode, and a second MOSFET of the first conductivity type, which has a first main electrode connected to a second voltage input terminal connected to the other terminal of the block and which is turned ON/OFF in correspondence with voltage impressed on a control electrode based on voltage impressed on a first main electrode; a first storage element provided with respect to each block and also connected between a second main electrode of the first MOSFET of the first conductivity type and a second main electrode of the second MOSFET of the first conductivity type; a second group of switches including a first MOSFET of a second conductivity type opposed to the first conductivity type, which has a second main electrode connected to one terminal of the first storage element and a first main electrode connected to a first voltage output terminal and which is turned ON/OFF in correspondence with a signal inputted to a control electrode, and a second MOSFET of the second conductivity type, which has a second main electrode connected to the other terminal of the first storage element and a first main electrode connected to a second voltage output terminal and which is turned ON/OFF in correspondence with a signal inputted to a control electrode; a third group of switches including a third MOSFET of the second conductivity type, which has a second main electrode connected to the control electrode of the first MOSFET of the first conductivity type and which is turned ON/OFF in correspondence with a signal inputted to a control electrode and a fourth MOSFET of the second conductivity type, which has a second main electrode connected to the control electrode of the second MOSFET of the first conductivity type and which is turned ON/OFF in correspondence with a signal inputted to a control electrode; and control means for turning on the first group of switches by turning on the third group of switches and for turning on the second group of switches while the first group of switches is turned off by turning off the third group of switches.

BEST MODE FOR CARRYING OUT THE INVENTION

Embodiments of the present invention will be described below in detail, with reference to drawings.

Figure 1:
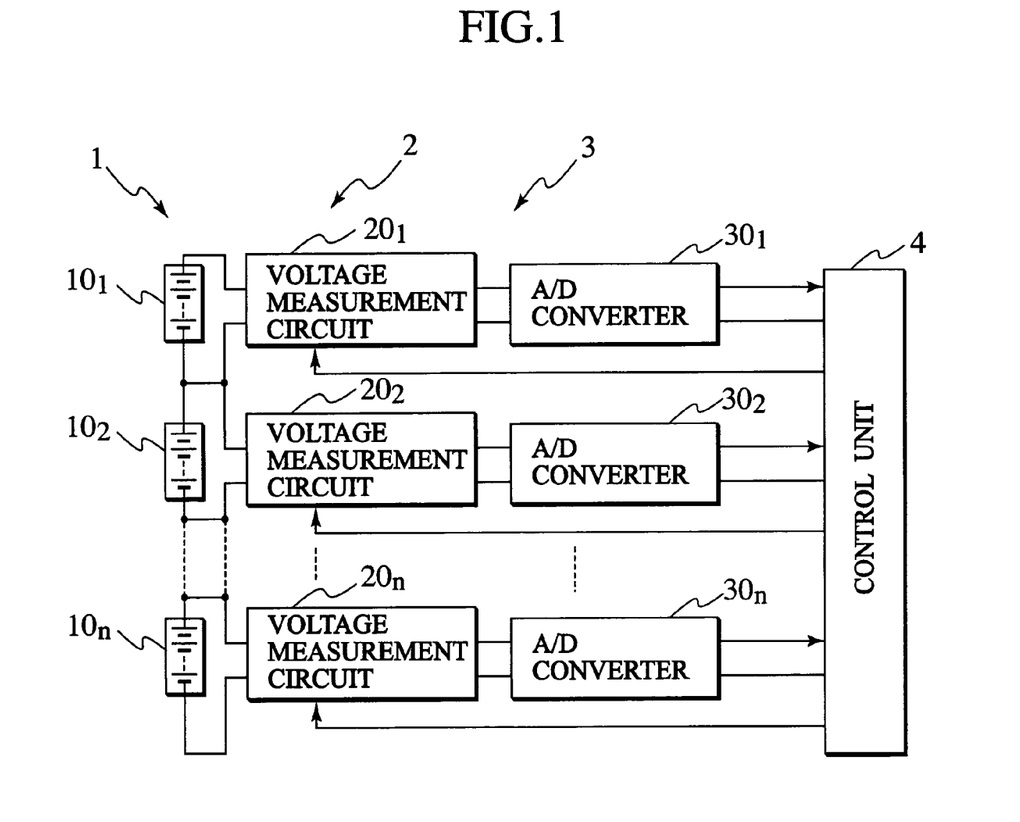
FIG. 1 is a block diagram showing a constitution of a voltage measurement device in accordance with a first to third embodiments of the present invention.

FIG. 1 is a view showing a constitution of a voltage measurement device in accordance with embodiments of the present invention. This voltage measurement device comprises a battery 1, a voltage measuring part 2, a voltage converting part 3 and a control unit 4.

The battery 1 is composed of n (n: integral number equal to or more than 1) blocks $10_1$~$10_n$ in series connection. Corresponding to a voltage source of the invention, each of the blocks 10 is formed by a plurality of battery cells in series connection. This battery 1 outputs high voltage, for example, 100~200V.

The voltage measuring part 2 is composed of n voltage measurement circuits $20_1$~$20_n$. The voltage measurement circuits $20_1$~$20_n$ have identical constitutions to each other. Corresponding to control signals from the control unit 4, the voltage measurement circuits $20_1$~$20_n$ get respective voltage from the blocks $10_1$~$10_n$ of the battery 1 and retain them. Then, corresponding to the control signals from the control unit 4, the voltage measurement circuits $20_1$~$20_n$ transmit the retained voltage to the voltage converting part 3.

The voltage converting part 3 is composed of, for example, n A/D converters $30_1$~$30_n$. The A/D converters $30_1$~$30_n$ have identical constitutions to each other. The A/D converters $30_1$~$30_n$ are supplied with voltage in the form of analogue signals from the voltage measurement circuits $20_1$~$20_n$, convert the analogue signals into digital signals and further transmit them to the control unit 4.

The control unit 4 supplies the voltage measurement circuits $20_1$~$20_n$ with the control signals to control their operations and adds the digital signals transmitted from the A/D converters $30_1$~$30_n$ to calculate overall voltage of the battery 1 and voltage with respect to each block. The so-calculated voltage is used to monitor a charging state, a discharging state, a lifetime, and malfunction, etc. of the battery 1.

1st Embodiment

Figure 2:
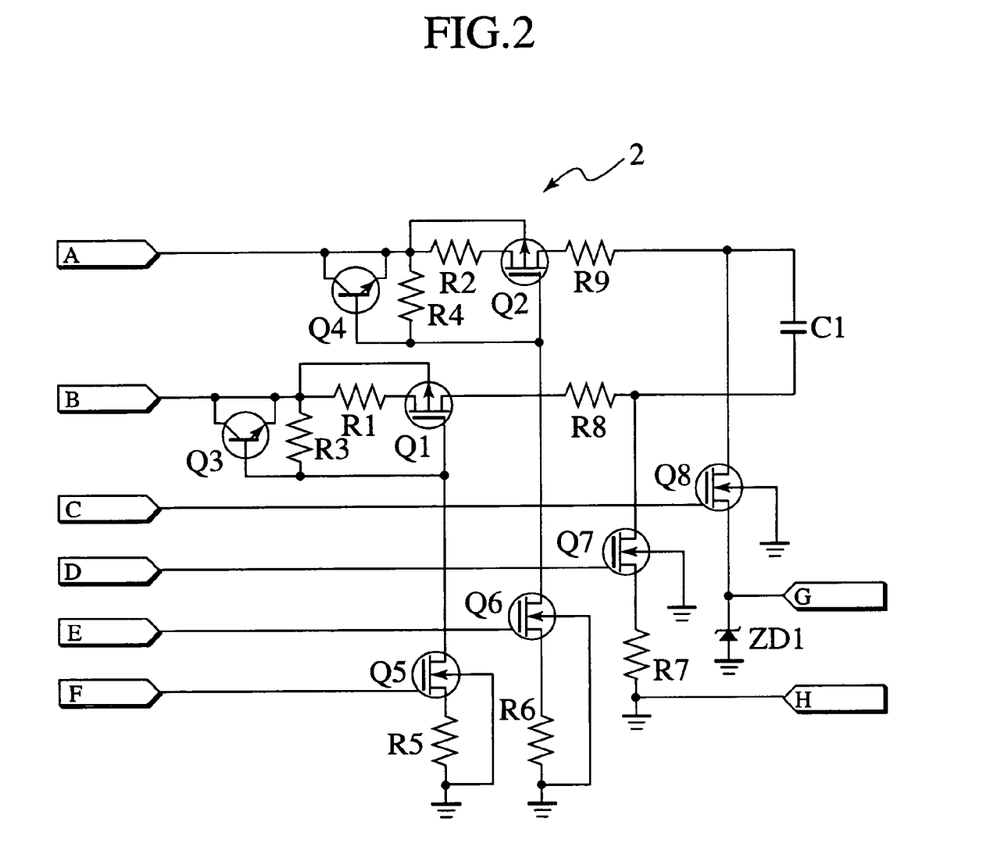
FIG. 2 is a circuit diagram showing a constitution of a voltage measurement circuit in the voltage measurement device of the first embodiment of the present invention.

FIG. 2 is a circuit diagram showing a constitution of the voltage measurement circuit in the voltage measurement device of the first embodiment of the present invention. This voltage measurement circuit corresponds to each of the voltage measurement circuits $20_1$~$20_n$ shown in FIG. 1.

The voltage measurement circuit includes voltage input terminals A and B, control-signal input terminals C, D, E and F and voltage output terminals G and H. The voltage input terminal A is connected to one terminal (positive terminal) of a block of the plural blocks $10_1$~$10_n$ forming the battery 1, while the voltage input terminal B is connected to the other terminal (negative terminal) of the same block. The voltage output terminals G and H are connected to one A/D converter of the plural A/D converters $30_1$~$30_n$. Further, the control-signal input terminals C, D, E and F are connected to the control unit 4.

This voltage measurement device includes a P-channel MOS field effect transistor (referred to as "Pch-MOSFET" hereinafter and corresponding to a MOSFET of a first conductivity type of the invention) Q1 and a Pch-MOSFET Q2 both forming a first group of switches, a N-channel MOS field effect transistor (referred to as "Nch-MOSFET" hereinafter and corresponding to a MOSFET of a second conductivity type of the invention) Q7 and a Nch-MOSFET Q8 both forming a second group of switches, and a Nch-MOSFET Q5 and a Nch-MOSFET Q6 both forming a third group of switches. As for these Pch-MOSFET Q1, Pch-MOSFET Q2, Nch-MOSFET Q5, Nch-MOSFET Q6, Nch-MOSFET Q7 and Nch-MOSFET Q8, there may be employed high withstand-voltage elements capable of withstanding a high voltage, for example, 500 V although the voltage value is dependent on voltage of the battery 1.

In the Pch-MOSFET Q2, its source (corresponding to a first main electrode of the invention) is connected to the voltage input terminal A through a resistance R2, while a drain (corres. a second main electrode of the invention) is connected to one terminal of a condenser C1 (corres. a first condenser element) through a resistance R9. A gate (corres. a control electrode of the invention) of the Pch-MOSFET Q2 is connected to a drain of the Nch-MOSFET Q6 and further, a back gate (substrate) is connected to the voltage input terminal A.

In order to establish a gate voltage of the Pch-MOSFET Q2, a NPN transistor Q4 functioning as a limiter for gate voltage as well as zener diode and a resistance R4 are connected in parallel between the back gate (the voltage input terminal A) and the gate of the Pch-MOSFET Q2. That is, in the NPN transistor Q4, its collector and emitter are connected to the back gate (the voltage input terminal A) of the Pch-MOSFET Q2, while a base of the NPN transistor Q4 is connected to the gate of the Pch-MOSFET Q2.

The resistance R2 corresponds to a resistive element forming a current limit part of the invention. The NPN transistor Q4 corresponds to a voltage limit element forming the current limit part of the invention. The resistance R2 and the NPN transistor Q4 restrict a current flowing through the Pch-MOSFET Q2 in order to prevent Pch-MOSFET Q2 from being broken. The resistance R9 is provided in order that an excessive current would not flow even if a current flows from a storage element side to a battery side with an unexpected situation. In this view, the resistance R9 serves to prevent an occurrence of excessive current, thereby preventing a breakdown of the Pch-MOSFET Q2. However, depending on the Pch-MOSFET Q2 and use conditions, the resistance R9 may be eliminated from the circuit.

Further, a source of the Pch-MOSFET Q1 is connected to the voltage input terminal B through a resistance R1, while a drain is connected to the other terminal of the condenser C1 through a resistance R8. A gate of the Pch-MOSFET Q1 is connected to a drain of the Nch-MOSFET Q5 and further, a back gate of the Pch-MOSFET Q1 is connected to the voltage input terminal B.

In order to establish a gate voltage of the Pch-MOSFET Q1, a NPN transistor Q3 functioning as a limiter for a gate voltage as well as zener diode and a resistance R3 are connected in parallel between the back gate (the voltage input terminal B) and the gate of the Pch-MOSFET Q1. That is, in the NPN transistor Q3, its collector and emitter are connected to the back gate (the voltage input terminal A) of the Pch-MOSFET Q1, while a base of the NPN transistor Q3 is connected to the gate of the Pch-MOSFET Q1.

The resistance R1 corresponds to a resistive element forming the current limit part of the invention, while the NPN transistor Q3 corresponds to a voltage limit element forming the current limit part of the invention. The resistance R1 and the NPN transistor Q3 restrict a current flowing through the Pch-MOSFET Q1 in order to prevent the Pch-MOSFET Q1 from being broken.

The resistance R8 is provided in order that an excessive current would not flow even if a current flows from a storage element side to a battery side with an unexpected situation. In this view, the resistance R8 serves to prevent an occurrence of excessive current, thereby preventing a breakdown of the Pch-MOSFET Q1. However, depending on the Pch-MOSFET Q1 and use conditions, the resistance R8 may be eliminated from the circuit.

The Nch-MOSFET Q6 is used to drive the Pch-MOSFET Q2. The drain of the Nch-MOSFET Q6 is connected to the gate of the Pch-MOSFET Q2, as mentioned above. A source of the Nch-MOSFET Q6 is connected to ground through a resistance R6 and further, a back gate (substrate) of the Nch-MOSFET Q6 is also connected to ground. The resistance R6 corresponds to a resistive element forming the current limit part of the invention. The resistance R6 restricts a current flowing through the Nch-MOSFET Q6 to prevent it from being broken.

Further, a gate of the Nch-MOSFET Q6 is connected to the control-signal input terminal E. Since voltage of high level (referred to as "H-level" below) is impressed on the control-signal input terminal E from outside, the Nch-MOSFET Q6 is turned on. Consequently, the Pch-MOSFET Q2 is also turned on, so that voltage from the voltage input terminal A is impressed on one terminal of the condenser C1.

The Nch-MOSFET Q5 is used to drive the Pch-MOSFET Q1. The drain of the Nch-MOSFET Q5 is connected to the gate of the Pch-MOSFET Q1, as mentioned above. A source of the Nch-MOSFET Q5 is connected to ground through a resistance R5 and further, a back gate (substrate) of the Nch-MOSFET Q5 is also connected to ground. The resistance R5 corresponds to a resistive element forming the current limit part of the invention. The resistance R5 restricts a current flowing through the Nch-MOSFET Q5 to prevent it from being broken.

Further, a gate of the Nch-MOSFET Q5 is connected to the control-signal input terminal F. The Nch-MOSFET Q5 is turned on since H-level voltage is impressed on the control-signal input terminal from outside. Consequently, the Pch-MOSFET Q1 is also turned on, so that voltage from the voltage input terminal B is impressed on the other terminal of the condenser C1.

A drain of the Nch-MOSFET Q8 is connected to one terminal of the condenser C1, while a source of the Nch-MOSFET Q8 is connected to the voltage output terminal G and a cathode of a zener diode ZD1. An anode of the zener diode ZD1 is connected to ground. Note that since an input impedance of the A/D converter is remarkably high, there is a possibility that voltage of the voltage output terminals rise due to electric capacitance and leak current to cause a breakdown of MOSFETS in the second group. The zener diode ZD1 is interposed to avoid such a breakdown. A back gate (substrate) of the Nch-MOSFET Q8 is connected to ground, while a gate of the Nch-MOSFET Q8 is connected to the control-signal input terminal C. Since H-level voltage is impressed on the control-signal input terminal C from outside, the Nch-MOSFET Q8 is turned on, so that a potential on one terminal of the condenser C1 is generated to the voltage output terminal G.

A drain of the Nch-MOSFET Q7 is connected to the other terminal of the condenser C1, while a source of the Nch-MOSFET Q7 is connected to the voltage output terminal H and ground through a resistance R7.

A back gate (substrate) of the Nch-MOSFET Q7 is connected to ground, while a gate of the Nch-MOSFET Q7 is connected to the control-signal input terminal D. Since H-level voltage is impressed on the control-signal input terminal D from outside, the Nch-MOSFET Q7 is turned on, so that a potential on the other terminal of the condenser C1 is generated to the voltage output terminal H.

The above-mentioned Pch-MOSFETs Q1 and Q2 are formed by high-voltage resistant transistors and therefore, a voltage source to be measured, which is connected to the voltage output terminals A and B, can be utilized for a source for driving the gates of the Pch-MOSFETs Q1 and Q2 just as it is.

That is, the resistance R4 and the NPN transistor Q4 functioning as a zener diode are connected in parallel between the gate and the source of the high-voltage resistant Pch-MOSFET Q2, through the resistance R2. Thus, during an ON state of a high-voltage resistant Nch-MOSFET Q6, it is possible to maintain voltage between the gate and the source of the Pch-MOSFET Q2 at a yield voltage since the NPN transistor Q4 is subjected to zener yield. While, during an OFF state of the high-voltage resistant Nch-MOSFET Q6, the gate and the source of the Pch-MOSFET Q2 are connected in short through the resistance R4, so that a gate charge of the Pch-MOSFET Q2 accumulated during the ON state is discharged and a gate potential of the Pch-MOSFET Q2 is fixed to a source potential.

Similarly, the resistance R3 and the NPN transistor Q3 functioning as a zener diode are connected in parallel between the gate and the source of the high-voltage resistant Pch-MOSFET Q1, through the resistance R1. Thus, during an ON state of a high-voltage resistant Nch-MOSFET Q5, it is possible to maintain voltage between the gate and the source of the Pch-MOSFET Q1 at a yield voltage since the NPN transistor Q3 is subjected to zener yield. While, during an OFF state of the high-voltage resistant Nch-MOSFET Q5, the gate and the source of the Pch-MOSFET Q1 are connected in short through the resistance R3, so that a gate charge of the Pch-MOSFET Q1 accumulated during the ON state is discharged and a gate potential of the Pch-MOSFET Q1 is fixed to a source potential.

Accordingly, there is no need to provide a special power source that supplies voltage to be impressed on the gates in order to activate or inactivate the Pch-MOSFETs Q1 and Q2, allowing the voltage measurement device to be small-sized at a low price.

Note that the above-mentioned first group of switches may comprise high-voltage resistant Nch-MOSFETs. However, when using the high-voltage resistant Pch-MOSFETs Q1 and Q2, it is possible to make a circuit structure of the device simpler than that in case of using the high-voltage resistant Nch-MOSFETs for the same purpose. Namely, if the high-voltage resistant Nch-MOSFETs are employed in place of the high-voltage resistant Pch-MOSFETs Q1 and Q2, then it is necessary to establish a gate potential for activating the Nch-MOSFETs higher than a source potential by a threshold voltage. Additionally, as the source potential rises up to the vicinity of potential of a voltage source to be measured on a drain's side on condition that each Nch-MOSFET is tuned ON, the gate potential should be raised higher than the potential of the voltage source to be measured in order to maintain the On-state of the Nch-MOSFET.

Thus, it is impossible to utilize the voltage source to be measured directly as a power source for driving the gates, as in the case of the Pch-MOSFETs used. Consequently, there would be separately required a circuit that generates gate-driving voltage higher than potentials of the voltage source to be measured at the voltage input terminals A and B by threshold voltage. In order to generate such gate-driving voltage, there may be used floating power drive, bootstrap drive, charge pump drive, etc. However, the structure of the circuit becomes complicated.

Next, an operation of the above-constructed voltage measurement device in accordance with the first embodiment of the invention will be described with reference to FIGS. 3A to 3C.

First, the control unit 4 supplies the control-signal input terminals C and D with control signals of low level (referred to as "L-level" below) and also supplies the control-signal input terminals E and F with H-level control signals. Consequently, as shown in FIG. 3A, the Nch-MOSFETs Q6 and Q5 are turned on, so that the Pch-MOSFETs Q2 and Q1 are also turned on, while the Nch-MOSFETs Q8 and Q7 are turned off. In this state, a current I flows from a block 10 forming the battery 1 so as to charge the condenser C1, as shown in the figure. This charging is maintained while holding the control signals for the control-signal input terminals E and F at H-levels until voltage between both terminals of the condenser C1 becomes equal to voltage between both terminals of the block 10.

Figure 3A:
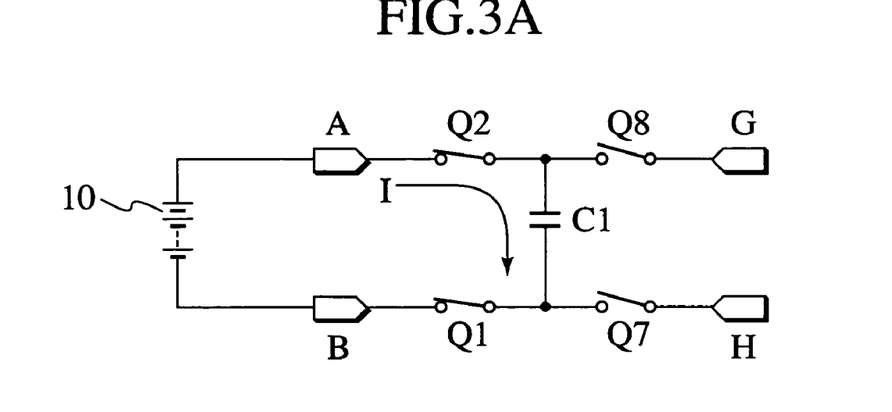
FIGS. 3A to 3C are views to explain an operation of the voltage measurement circuit in the voltage measurement device of the first embodiment of the present invention.

Next, in the state shown in FIG. 3A, the control unit 4 supplies the control-signal input terminals E and F with L-level control signals. Consequently, as shown in FIG. 3B, the Nch-MOSFETs Q6 and Q5 are turned off, so that the Pch-MOSFETs Q2 and Q1 are turned off. Further, the Nch-MOSFETs Q8 and Q7 are maintained in the OFF state. In this state, the condenser C1 holds voltage based on the previous charging.

Figure 3B:
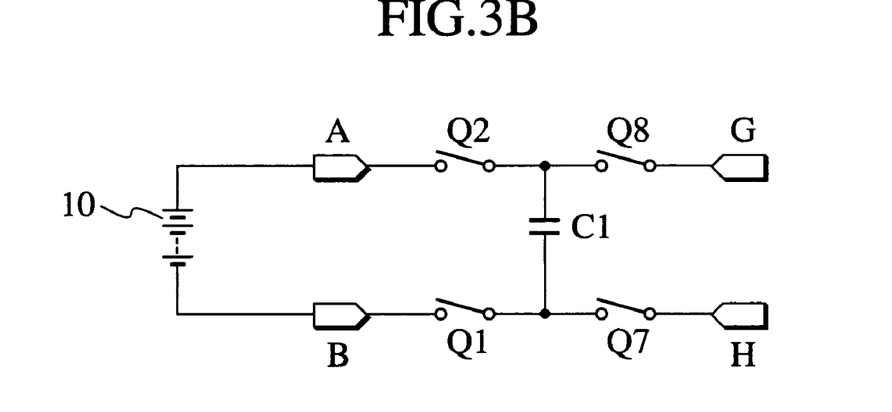
Figure 3C:
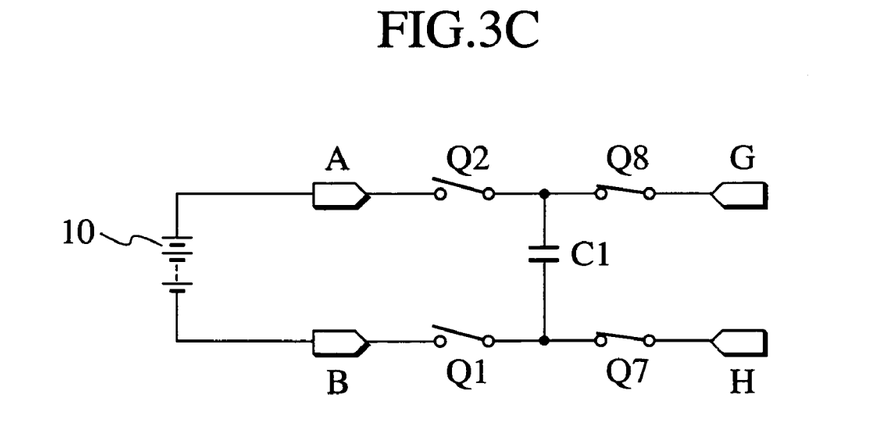

Next, in the state shown in FIG. 3B, the control unit 4 supplies the control-signal input terminals C and D with H-level control signals. Consequently, as shown in FIG. 3C, the Nch-MOSFETs Q8 and Q7 are turned on, so that voltage between both ends of the condenser C1 is generated between the voltage output terminal G and the voltage output terminal H. Subsequently, the situation returns to the state of FIG. 3A via the state of FIG. 3B and thereafter, the above-mentioned measuring cycle is repeated.

As mentioned above, according to the voltage measurement device of the first embodiment, as the Pch-MOSFETs and the Nch-MOSFETs in place of photo MOSFETs are utilized as the first to third groups of switches, the speed of response becomes faster and additionally, the switching operation of the condenser between charging and discharging can be attained precisely and rapidly. As a result, it is possible to measure voltage of a battery with high accuracy and at a high speed.

Furthermore, as the Pch-MOSFETs forming the first group of switches are turned ON/OFF in correspondence with voltage impressed on the control electrodes based on voltage from the voltage source and the Nch-MOSFETs forming the second and third groups of switches are turned ON/OFF in correspondence with signals from outside, there is no need to provide any special power source, realizing a low-priced and small-sized voltage measurement device.

Further, since the miniaturization and high-integration of the Pch-MOSFET and the Nch-MOSFET are easy, it is possible to realize a low-priced and small-sized voltage measurement device. Again, as the Pch-MOSFET and the Nch-MOSFET are easy to be resistant to high temperature in comparison with the photo MOSFET, they are applicable to a battery having a high working temperature, such as fuel battery.

The above-mentioned voltage measurement device is utilized as the voltage measurement circuits $20_1 \sim 20_n$ shown in FIG. 1. That is, the control unit 4 transmits control signals to the voltage measurement circuits $20_1 \sim 20_n$ and allows them to perform the following actions. That is, the first group of switches included in the voltage measurement circuits $20_1 \sim 20_n$ are turned on. As a result, the respective condensers C1 contained in the voltage measurement circuits $20_1 \sim 20_n$ are charged up. Next, the first group of switches included in the voltage measurement circuits $20_1 \sim 20_n$ are turned off and thereafter, the second group of switches are turned on.

Consequently, voltage are outputted from the respective voltage output terminals G and H of the voltage measurement circuits $20_1 \sim 20_n$ in unison and supplied to the A/D converters $30_1 \sim 30_n$. Then, the A/D converters $30_1 \sim 30_n$ convert so-inputted analogue signals of voltage into digital signals and further transmit them to the control unit 4. The control unit 4 accumulates the digital signals transmitted from the A/D converters $30_1 \sim 30_n$ to calculate overall voltage of the battery 1 and voltage with respect to each block. The so-calculated voltage is used to monitor the charging situation of the battery 1, its discharging situation, the lifetime of the battery, the presence of malfunction, etc.

Figure 4:
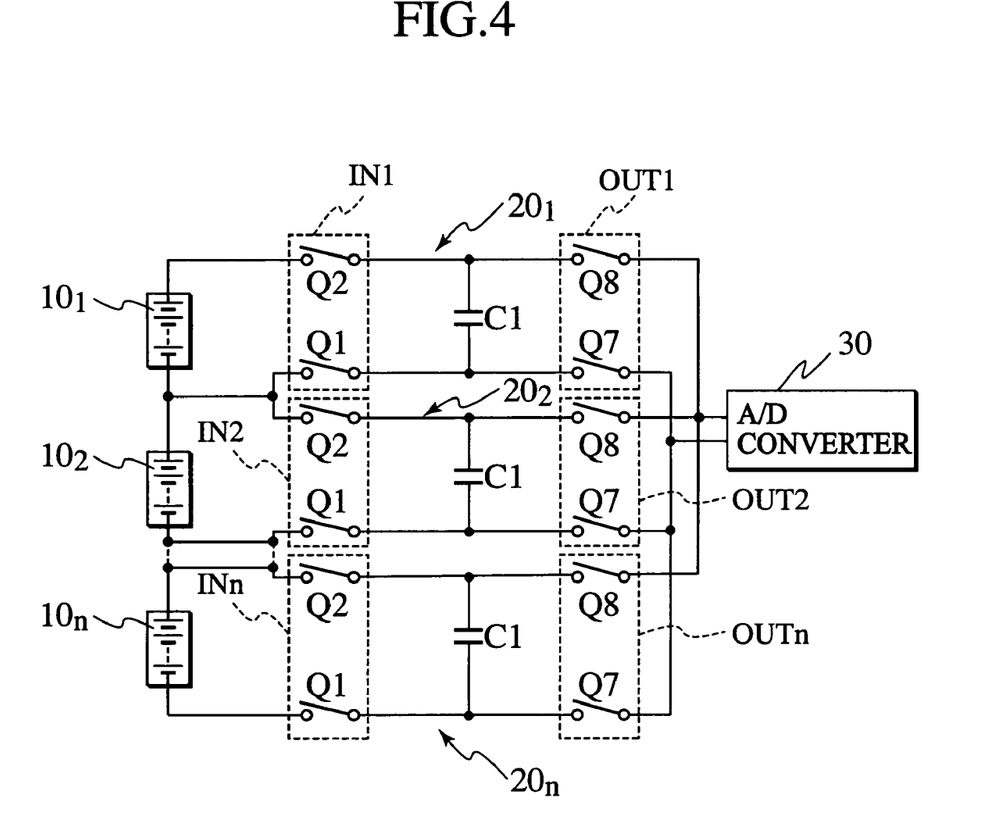
FIG. 4 is a block diagram showing a modification of the voltage measurement device of the first embodiment of the present invention.
Figure 5A:
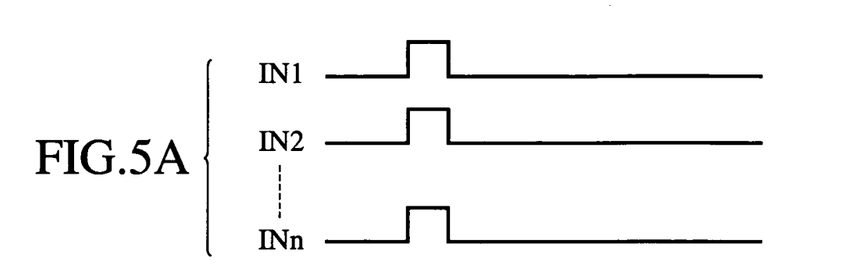
FIGS. 5A and 5B are timing charts to explain one operation of the modification shown in FIG. 4.

The voltage measurement device of FIG. 1 may be modified as shown in FIG. 4. That is, the voltage converting part 3 is formed by a single A/D converter 30. In this case, the control unit 4 controls the voltage measurement circuits $20_1 \sim 20_n$ as follows. In detail, as shown in FIG. 5A, the control unit 4 first transmits control signals IN1~INn to turn on the first group of switches included in the voltage measurement circuits $20_1 \sim 20_n$ simultaneously. As a result, the respective condensers contained in the voltage measurement circuits $20_1 \sim 20_n$ are charged.

Figure 5B:
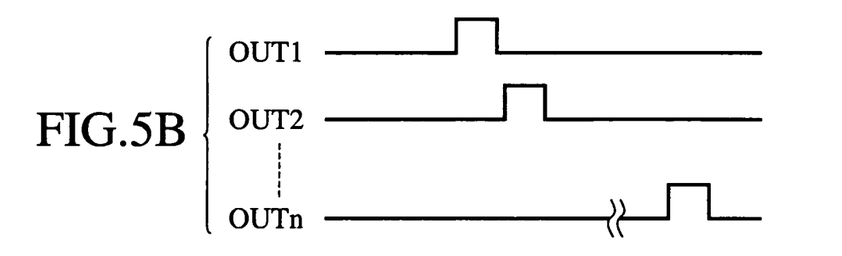

Next, the first group of switches included in the voltage measurement circuits $20_1 \sim 20_n$ are turned off and thereafter, the control unit 4 transmits control signals OUT1~OUTn to turn on the second group of switches included in the voltage measurement circuits $20_1 \sim 20_n$ in sequence, as shown in FIG. 5B. Consequently, voltage are outputted from the voltage measurement circuits $20_1 \sim 20_n$ in sequence and supplied to the A/D converter 30. The control unit 4 accumulates the digital signals transmitted from the A/D converter 30 in a chasing manner to calculate overall voltage of the battery 1. Depending on the circumstances, only digital signals transmitted at desired intervals may be processed to calculate voltage of one or more blocks desired.

According to the constitution like this, since the number of A/D converters can be reduced, it is possible to form a voltage measurement device at a low price and in a small size. Additionally, as charging of the condensers C1 contained in all the voltage measurement circuits $20_1$~$20_n$ is performed simultaneously and the measurement can be performed in sequence with respect to any block, it is possible to precisely measure a battery voltage of a vehicle-installed battery at a certain instant, for example, rapid acceleration, braking, etc.

Further, by control signals outputted from the control unit 4, the device may be constructed so as to perform the charging operation for the condensers C1 contained in the voltage measurement circuits $20_1$~$20_n$ at different timings.

Figure 6A:
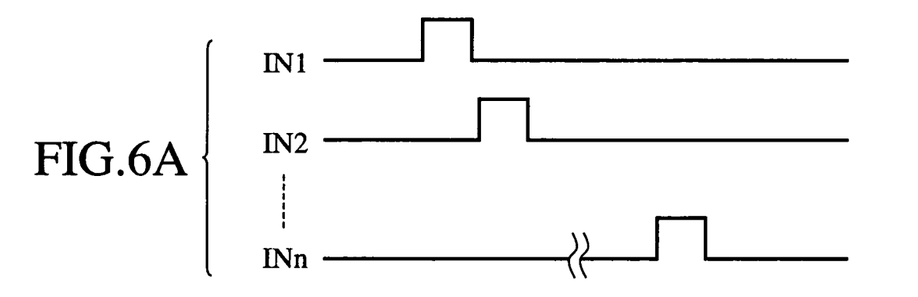
FIGS. 6A and 6B are timing charts to explain the other operation of the modification shown in FIG. 4.

As shown in FIG. 6A, the control unit 4 first transmits control signals IN1~INn to turn on the first group of switches contained in the voltage measurement circuits $20_1$~$20_n$ in sequence. As a result, the respective condensers contained in the voltage measurement circuits $20_1$~$20_n$ are charged in sequence. After the charging, the first group of switches of the voltage measurement circuits $20_1$~$20_n$ including the charged condensers C1 are turned off.

Figure 6B:
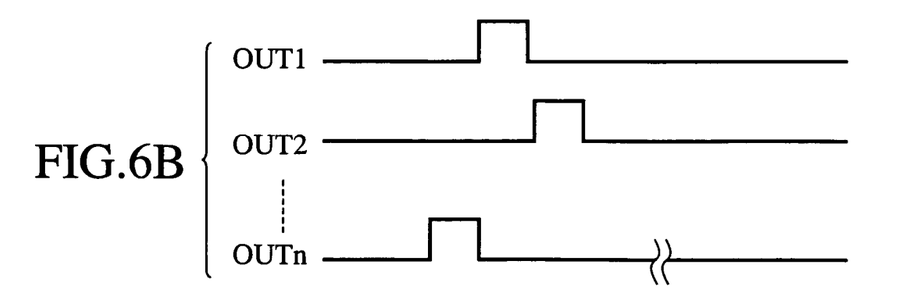

Next, as shown in FIG. 6B, the control unit 4 transmits control signals OUT1~OUTn to turn on the second group of switches included in the voltage measurement circuits $20_1$~$20_n$ out of charging.

Consequently, voltage are generated from the non-charging voltage measurement circuits $20_1$~$20_n$ in sequence and supplied to the A/D converter 30. The control unit 4 accumulates the digital signals transmitted from the A/D converter 30 in a chasing manner to calculate overall voltage of the battery 1. Depending on the circumstances, only digital signals transmitted at desired intervals may be processed to calculate voltage of one or more blocks desired.

According to the constitution like this, since the charging of the condensers C1 contained in the voltage measurement circuits $20_1$~$20_n$ is performed in sequence while picking up voltage from the non-charging condensers C1, the charging and picking up operations among the different voltage measurement circuits $20_1$~$20_n$ can be performed at the same time, allowing a measuring time to be shortened.

Note that although the single A/D converter is provided for n voltage measurement circuits $20_1$~$20_n$ in this modification, there may be provided m (m: an integral number more than one, m<n) A/D converters in a modification. Also in this case, if the control unit 4 controls the first and second groups of switches in the voltage measurement circuits $20_1$~$20_n$ properly, then it is possible to bring about an effect as well or better than one mentioned above.

2$^{nd}$ Embodiment

A voltage measurement device in accordance with the second embodiment of the present invention is provided to correct error voltage caused due to stray capacitances of switches etc. in view of speeding up a measurement cycle of the device.

Figure 7:
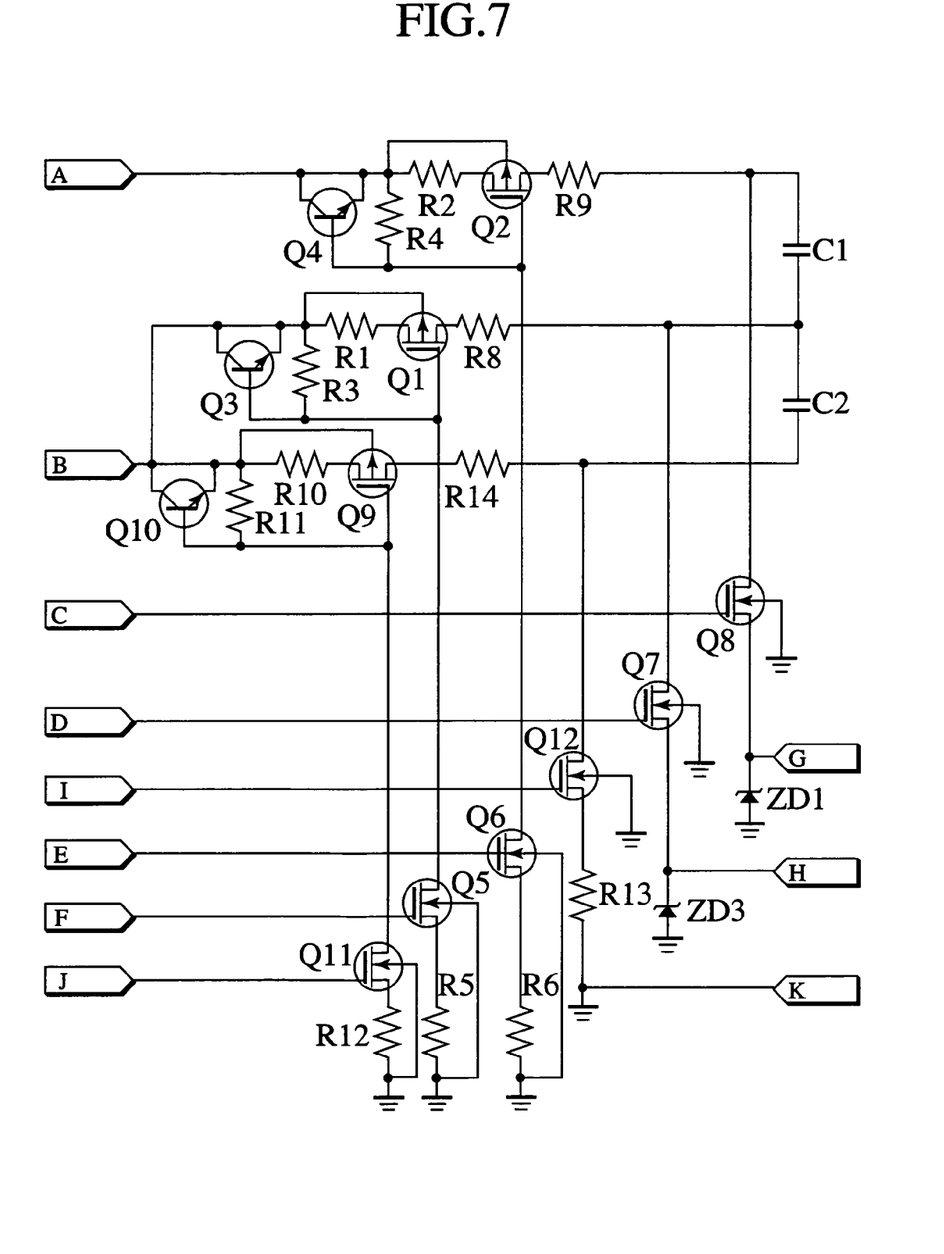
FIG. 7 is a circuit diagram showing a constitution of the voltage measurement circuit in the voltage measurement device of the second embodiment of the present invention.

FIG. 7 is a circuit diagram showing a constitution of a voltage measurement circuit in the voltage measurement device of the second embodiment. This voltage measurement circuit is provided by adding a control-signal input terminal I, a control-signal input terminal J, a voltage output terminal K and a dummy condenser C2 (corresponding to a second storage element of the invention) to the voltage measurement circuit of the first embodiment of FIG. 2 and further adding a high-voltage resistant Pch-MOSFET Q 9, a high-voltage resistant Nch-MOSFET Q 11 and a Nch-MOSFET Q 12 to the first group of switches, the third group of switches and the second group of switches, respectively. The dummy condenser C2 has one terminal connected to the other terminal of the condenser C1.

A source of the Pch-MOSFET Q9 is connected to the voltage input terminal B through a resistance R10, while a drain is connected to the other terminal of the dummy condenser C2 through a resistance R14. Again, a gate of the Pch-MOSFET Q9 is connected to a drain of the Nch-MOSFET Q11 and further, a back gate of the Pch-MOSFET Q9 is connected to the voltage input terminal B.

In order to establish a gate voltage of the Pch-MOSFET Q9, a NPN transistor Q10 and a resistance R11 are connected in parallel between the back gate (the voltage input terminal B) and the gate of the Pch-MOSFET Q9, functioning as a limiter for a gate voltage as well as zener diode. That is, in the NPN transistor Q10, its collector and emitter are connected to the back gate (the voltage input terminal B) of the Pch-MOSFET Q9, while a base of the NPN transistor Q10 is connected to the gate of the Pch-MOSFET Q9.

The resistance R10 corresponds to a resistive element forming a current limit part of the invention, while the NPN transistor Q10 corresponds to a voltage limit element forming the current limit part of the invention. The resistance R10 and the NPN transistor Q10 restrict a current flowing through the Pch-MOSFET Q9 in order to prevent Pch-MOSFET Q9 from being broken.

The Nch-MOSFET Q11 is used to drive the Pch-MOSFET Q2. The drain of the Nch-MOSFET Q11 is connected to the gate of the Pch-MOSFET Q9, as mentioned above. Again, a source of the Nch-MOSFET Q11 is connected to ground through a resistance R12 and further, a back gate (substrate) of the Nch-MOSFET Q11 is also connected to ground. The resistance R12 corresponds to a resistive element forming the current limit part of the invention. The resistance R12 restricts a current flowing through the Nch-MOSFET Q11 to prevent it from being broken.

Further, a gate of the Nch-MOSFET Q11 is connected to the control-signal input terminal J. The Nch-MOSFET Q11 is turned on since H-level voltage is impressed on the control-signal input terminal J from outside. Consequently, the Pch-MOSFET Q9 is also turned on, so that voltage from the voltage input terminal B is impressed on the other terminal of the dummy condenser C2.

A drain of the Nch-MOSFET Q12 is connected to the other terminal of the dummy condenser C2, while a source of the Nch-MOSFET Q12 is connected to the voltage output terminal K and ground through a resistance R13. A back gate (substrate) of the Nch-MOSFET Q12 is connected to ground, while a gate of the Nch-MOSFET Q12 is connected to the control-signal input terminal I. Since H-level voltage is impressed on the control-signal input terminal I from outside, the Nch-MOSFET Q12 is turned on, so that a potential on the other terminal of the dummy condenser C1 is generated to the voltage output terminal K.

The source of the Nch-MOSFET Q7 is connected to the voltage output terminal H and a cathode of a zener diode ZD3, while an anode of the zener diode ZD3 is connected to ground. Note that since an input impedance of the A/D converter is remarkably high, there is a possibility that voltage of the voltage output terminals rise due to electric capacitance and leak current to cause a breakdown of MOSFETs in the second group. The zener diode ZD3 is interposed to avoid such a breakdown.

In this example, the zener diode ZD1 is inserted between the voltage output terminal G and ground, and the zener diode ZD3 is inserted between the voltage output terminal H and ground. However, the arrangement may be modified to one where, for instance, a cathode of a first zener diode is connected to the voltage output terminal G, a cathode of a second zener diode is connected to the voltage output terminal H, anodes of the first and second zener diodes are connected in common, a cathode of a third zener diode is connected to a resulting connecting point between the anodes of the first and second zener diodes, and an anode of the third zener diode is connected to the voltage output terminal K.

In the above-mentioned voltage measurement device of the first embodiment (see FIG. 2), when turning on the Pch-MOSFETs Q1 and Q2, an electric charge is accumulated in the condenser C1 and simultaneously, an electric charge is accumulated in parasitic capacitances of the Nch-MOSFETs Q7 and Q8, too. When turning on the Nch-MOSFETs Q8 and Q7, there appears, between the voltage output terminal G and the voltage output terminal H, voltage which is retained in a capacity existing between the terminals. Nevertheless, since the voltage output terminal H is used as ground potential, the electric charge accumulated in the parasitic capacitance of the Nch-MOSFET Q7 is discharged into ground, so that there arises, at the voltage output terminal G, voltage corresponding to the electric charge accumulated in both the condenser C1 and the parasitic capacitances of the Nch-MOSFET Q8, namely, voltage which is greater than voltage to be measured, by the electric charge of the Nch-MOSFET Q8. As the condenser C1, therefore, it would be required to use a condenser having a capacity negligible to an error by the parasitic capacitance of the Nch-MOSFET Q8, that is, the condenser having a capacity sufficiently larger than the parasitic capacitance of the Nch-MOSFET Q8. As a result, the charge/discharge periods of the electric charge of the condenser C1 would be expanded to cause the difficulty of speeding up the measurement cycle.

The voltage measurement device of the second embodiment is provided to solve such a problem. The feature resides in the provision of the dummy condenser C2 in consideration of the symmetry between a circuit viewed from the voltage input terminal A and a circuit viewed from the voltage input terminal B. That is, when turning on the Pch-MOSFETs Q1, Q2 and Q9, the electric charge based on voltage from the voltage input terminal A and the voltage input terminal B is accumulated in the condenser C1 and the dummy condenser C2, respectively. Simultaneously, the electric charge is also accumulated in the parasitic capacitances of the Nch-MOSFETs Q8 and Q7.

In this voltage measurement circuit, the voltage input terminal K is used for the ground terminal. Therefore, since there is no way out of the electric charge accumulated in the parasitic capacitance despite that the electric charge is accumulated in the identical condenser capacity and the same parasitic capacitance, and the Nch-MOSFETs Q8 and Q7 are turned on, accurate voltage corresponding to a potential difference between the voltage input terminal A and the voltage input terminal B comes in being between the voltage output terminal G and the voltage output terminal H.

More in detail, voltage corresponding to the sum of the condenser capacity C1 and the parasitic capacitance ($\alpha1$) of the Nch-MOSFET Q8 is outputted from the Nch-MOSFET Q8 to the voltage output terminal G, while voltage corresponding to the parasitic capacitance ($\alpha2$) of the Nch-MOSFET Q7 is outputted from the Nch-MOSFET Q7 to the voltage output terminal H. Here, as end-to-end voltage of the dummy condenser C2 is zero and both values of the parasitic capacitances $\alpha1$ and $\alpha2$ are equal to each other, the potential difference between the voltage output terminal G and the voltage output terminal H becomes voltage corresponding to the condenser capacity C1. Accordingly, as there is no need to increase the capacity of the condenser C1 in consideration of an error, it is possible to shorten the charge/discharge periods, allowing the measurement cycle to be accelerated.

$3^{rd}$ Embodiment

A voltage measurement device in accordance with the third embodiment of the present invention is provided to enable measurement of negative voltage.

Figure 8:
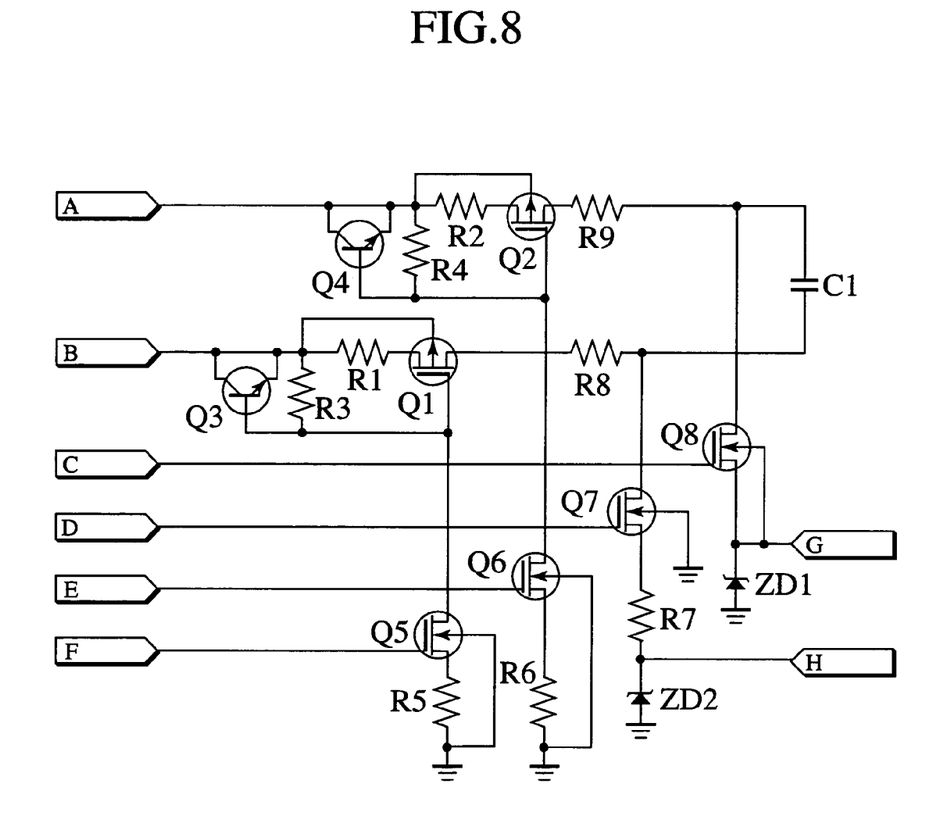
FIG. 8 is a circuit diagram showing a constitution of the voltage measurement circuit in the voltage measurement device of the third embodiment of the present invention.

FIG. 8 is a circuit diagram showing a constitution of a voltage measurement circuit in the voltage measurement device of the third embodiment. In this voltage measurement circuit, different from the voltage measurement circuit of the first embodiment of FIG. 2, the source of the Nch-MOSFET Q8 is connected to its back gate (substrate) and the voltage output terminal H is connected to ground through a zener diode ZD2. By use of the zener diode ZD2, it becomes possible to lift up potential of the voltage output terminal H, which will be used as reference potential in a subsequent stage, from ground potential by constant voltage with the use of a power source not shown. As a result, even if the potential difference between the voltage input terminals A and B both connected to the voltage source represents negative potential, it becomes possible to measure such negative potential.

Regarding the voltage measurement circuit of the first embodiment (see FIG. 2), it should be noted that the Nch-MOSFET Q8 is turned on when outputting voltage accumulated in the condenser C1 to the voltage output terminals G and H. Then, if voltage of the power source to be measured is higher than source/back-gate withstand voltage of the Nch-MOSFET Q8, a breakdown occurs between the voltage output terminal G and ground, thereby causing an impossibility of measuring voltage.

Additionally, a threshold value of the Nch-MOSFET Q8 is elevated due to substrate bias effect, requiring higher gate voltage.

On the contrary, the voltage measurement circuit of the third embodiment does not have such a problem because the source and the back gate of the Nch-MOSFET Q8 are connected to each other in short. With this constitution, it is possible to measure higher voltage without depending on a withstand voltage of the back-gate.

Further, since the absence of substrate bias effect does not cause a threshold value of the Nch-MOSFET Q8 to be raised, it can be turned ON/OFF without impressing high voltage on the gate.

The source of the Nch-MOSFET Q7 is connected to the voltage output terminal H and the cathode of the zener diode ZD2 through the resistance R7, while an anode of the zener diode ZD2 is connected to ground. Note that since an input impedance of the A/D converter is remarkably high, there is a possibility that the voltage of the voltage output terminals rises due to electric capacitance and leak current to cause a breakdown of MOSFETs in the second group. The zener diode ZD2 is interposed to avoid such a breakdown.

Note that the third embodiment is equivalent to an arrangement where the source of the Nch-MOSFET Q8 in the voltage measurement device of the first embodiment is connected to the back gate (substrate) and the voltage output terminal H is connected to ground through the zener diode ZD2. Alternatively, the third embodiment may be modified to an arrangement where the source of the Nch-MOSFET Q8 in the voltage measurement device of the second embodiment is connected to the back gate (substrate) and the voltage output terminal H is connected to ground through the zener diode ZD3. Then, the arrangement has similar operation and effects to those of the above-mentioned arrangement.

4$^{th}$ Embodiment

Figure 9:
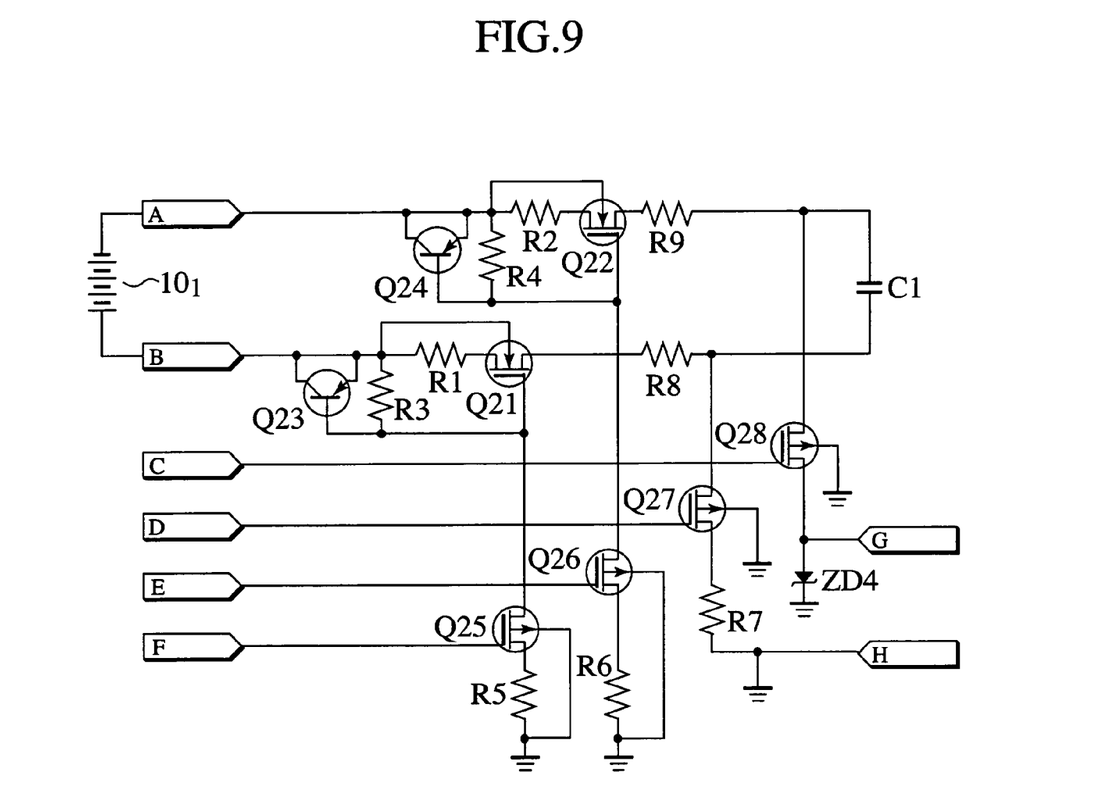
FIG. 9 is a circuit diagram showing a constitution of the voltage measurement circuit in the voltage measurement device of a fourth embodiment of the present invention.

FIG. 9 is a circuit diagram showing a constitution of a voltage measurement circuit in the voltage measurement device of the fourth embodiment. In the voltage measurement circuit of FIG. 2, under condition that the plural voltage sources generate positive voltage, the first group of switches comprises Pch-MOSFETs, while the second and third groups of switches comprise Nch-MOSFETs. On the contrary, the voltage measurement circuit of FIG. 9 is characterized in that, under condition that the plural voltage sources generate negative voltage, the first group of switches comprises Nch-MOSFETs, while the second and third groups of switches comprise Pch-MOSFETs.

Here, we describe only different constituents of the circuit from the constituents shown in FIG. 2. The voltage input terminal A is connected to one terminal (negative pole terminal) of a block, while the voltage input terminal B is connected to the other terminal (positive pole terminal) of the same block. There are provided, a Nch-MOSFET Q22 in place of the Pch-MOSFET Q2, a PNP transistor Q24 in place of the NPN transistor Q4, a Nch-MOSFET Q21 in place of the Pch-MOSFET Q1, and a PNP transistor Q23 in place of the NPN transistor Q3. Additionally, a Pch-MOSFET Q25 is arranged in place of the Nch-MOSFET Q5, a Pch-MOSFET Q26 in place of the Nch-MOSFET Q6, a Pch-MOSFET Q27 in place of the Nch-MOSFET Q7, and a Pch-MOSFET Q28 is arranged in place of the Nch-MOSFET Q8. A zener diode ZD4 is arranged in place of the zener diode ZD1.

According to the above-mentioned voltage measurement device of the fourth embodiment, the control unit 4 supplies the control-signal input terminals C and D with H-level control signals and also supplies the control-signal input terminals E and F with L-level control signals. Consequently, as shown in FIG. 3A, the Pch-MOSFETs Q26 and Q25 are turned on, so that the Nch-MOSFETs Q22 and Q21 are also turned on, while, the Pch-MOSFETs Q28 and Q27 are turned off. In this state, a current I flows from a block 10 forming the battery 1 as shown in the figure, so that the condenser C1 is charged. This charging is maintained while holding the control signals for the control-signal input terminals E and F at L-levels until voltage between both terminals of the condenser C1 becomes equal to voltage between both terminals of the block 10.

Next, in the state shown in FIG. 3A, the control unit 4 supplies the control-signal input terminals E and F with H-level control signals. Consequently, as shown in FIG. 3B, the Pch-MOSFETs Q26 and Q25 are turned off, so that the Nch-MOSFETs Q22 and Q21 are turned off. Further, the Pch-MOSFETs Q28 and Q27 are maintained in the OFF state. In this state, the condenser C1 holds voltage based on the previous charging.

Next, in the state shown in FIG. 3B, the control unit 4 supplies the control-signal input terminals C and D with L-level control signals. Consequently, as shown in FIG. 3C, the Pch-MOSFETs Q28 and Q27 are turned on, so that voltage between both ends of the condenser C1 is generated between the voltage output terminal G and the voltage output terminal H. Subsequently, the situation returns to the state of FIG. 3A via the state of FIG. 3B and thereafter, the above-mentioned measuring cycle is repeated.

That is, the voltage measurement device of the fourth embodiment has similar operation and effects to those of the voltage measurement device of the first embodiment.

Note that in each of the modification of the voltage measurement device of the first embodiment and the other variations (FIGS. 4 to 6A, 6B), in the voltage measurement device of the second embodiment (FIG. 7) and in the voltage measurement device of the third embodiment (FIG. 8), the first group of switches may be formed by Nch-MOSFETs and further, the second and third groups of switches may be formed by Pch-MOSFETs on condition of establishing a plurality of voltage sources of negative voltage. Even if the devices are constructed like this, the similar operation and effects would be achieved.

INDUSTRIAL APPLICABILITY

As mentioned above, according to the present invention, when the third group of switches are turned on, the first group of switches are turned on since, so that the first storage element is charged by voltage impressed between the first voltage-input terminal and the second voltage-input terminal. Further, while the first group of switches is turned off by turning off the third group of switches, when the second group of switches is turned on, voltage retained in the first storage element is generated between the first voltage-output terminal and the second voltage-output terminal. That is, since the switches used as the constituents of the first to third groups of switches are not photo-MOSFETs but the first conductivity type of MOSFETs (e.g. Pch-MOSFETs) and the second conductivity type of MOSFETs (e.g. Nch-MOSFETs), the rate of reaction of the device is high and it is possible to perform the switching operation of the first storage element between charging and discharging precisely and rapidly, allowing voltage to be measured with high accuracy and at a high speed. Again, as it is easy for both Pch-MOSFET and Nch-MOSFET to be small-sized with high integration, it is possible to provide a small-sized voltage measurement device at a lower price. Furthermore, as both Pch-MOSFET and Nch-MOSFET are easy to be resistant to high temperatures in comparison with photo MOSFET, they are applicable to a battery having a high working temperature, such as fuel battery.

Again, according to the present invention, when the third group of switches are turned on, the first group of switches are turned on since, so that the first storage element is charged by voltage impressed between the first voltage-input terminal and the second voltage-input terminal. Further, while the first group of switches is turned off by turning off the third group of switches, when the second group of switches is turned on, voltage retained in the first storage element is generated between the first voltage-output terminal and the second voltage-output terminal. Additionally, the third voltage-output terminal is held at ground potential. Therefore, it is possible to correct a voltage error appearing between the first voltage-output terminal and the second voltage-output terminal based on the stray capacitances of the first and second Nch-MOSFETs forming the second group of switches. As a result, with a reduction of the capacity of the first storage element, it is possible to shorten the charging/discharging time of the first storage element, allowing voltage to be measured at a high speed and with high accuracy.

Additionally, according to the present invention, even when a difference in potential between the first voltage-input terminal and the second voltage-input terminal, which are together connected to a voltage source to be measured, exhibits negative potential due to defects of the battery, it is possible to measure voltage of the battery.

Again, according to the present invention, even if a superposition of noises on signals etc. from outside causes a situation where a Pch-MOSFET forming the first group of switches and a Nch-MOSFET forming the second group of switches are turned on simultaneously, it is possible to avoid a situation that respective elements forming the voltage measurement device and an instrument connected to the first and second voltage-output terminals are broken.

Still further, according to the present invention, since the constant current characteristic can be attained since only low-cost resistant elements and voltage limit elements restrict currents flowing through the MOSFETs forming the first to third groups of switches, there is no need of expensive components for constant current characteristic, such as FET. Consequently, it is possible to construct a voltage measurement device in a low price.

Further, according to the present invention, as charging of all the first storage elements is performed simultaneously and the measurement can be performed every optional block in sequence, it is possible to precisely measure instantaneous battery voltage of a vehicle-installed battery, for example, at a rapid accelerating, braking, etc.

Further, according to the present invention, if the first group of switches and the second group of switches are controlled in a manner that the operation of charging the first storage element does not overlap with the operation of measuring an output of the first storage element, then it is possible to shorten a measuring time with the possibility of charging and measuring voltage every optional block.

Further, according to the present invention, the Pch-MOSFETs forming the first group of switches turn ON/OFF corresponding to voltage impressed on the control electrodes based on voltage from the voltage source, while the Nch-MOSFETs forming the second and third groups of switches turn ON/OFF corresponding to respective input signals. Thus, the drive of such switches dispenses with an exclusive power source, realizing a small-sized voltage measurement device at a low price.

Alternatively, according to the present invention, the Nch-MOSFETs forming the first group of switches turn ON/OFF corresponding to voltage impressed on the control electrodes based on voltage from the voltage source, while the Pch-MOSFETs forming the second and third groups of switches turn ON/OFF corresponding to respective input signals. Thus, the drive of such switches dispenses with an exclusive power source, realizing a small-sized voltage measurement device at a low price.

Further, according to the present invention, owing to the provision of the voltage limit element, there is no possibility that voltage at the voltage output terminal rises due to its electric capacitance and leak current, whereby a breakage of the MOSFETs forming the second group of switches can be avoided.

The invention claimed is:

1. A voltage measurement device for dividing a plurality of voltage sources into a plurality of blocks each having at least one voltage source and for measuring voltage of a block, the voltage measurement device comprising:
 a first group of switches including a first MOSFET of a first conductivity type, which has a first main electrode connected to a first voltage input terminal connected to one terminal of a block and which is turned ON/OFF in correspondence with voltage impressed on a control electrode based on voltage impressed on the first main electrode, and a second MOSFET of the first conductivity type, which has a first main electrode connected to a second voltage input terminal connected to the other terminal of the block and which is turned ON/OFF in correspondence with voltage impressed on a control electrode based on voltage impressed on the first main electrode;
 a first storage element provided with respect to each block and also connected between a second main electrode of the first MOSFET of the first conductivity type and a second main electrode of the second MOSFET of the first conductivity type;
 a second group of switches including a first MOSFET of a second conductivity type opposed to the first conductivity type, which has a second main electrode connected to one terminal of the first storage element and a first main electrode connected to a first voltage output terminal and which is turned ON/OFF in correspondence with a signal inputted to a control electrode, and a second MOSFET of the second conductivity type, which has a second main electrode connected to the other terminal of the first storage element and a first main electrode connected to a second voltage output terminal and which is turned ON/OFF in correspondence with a signal inputted to a control electrode;
 a third group of switches including a third MOSFET of the second conductivity type, which has a second main electrode connected to the control electrode of the first MOSFET of the first conductivity type and which is turned ON/OFF in correspondence with a signal inputted to a control electrode and a fourth MOSFET of the second conductivity type, which has a second main electrode connected to the control electrode of the second MOSFET of the first conductivity type and which is turned ON/OFF in correspondence with a signal inputted to a control electrode; and
 control means for turning on the first group of switches by turning on the third group of switches and for turning on the second group of switches while the first group of switches is turned off by turning off the third group of switches.

2. The voltage measurement device of claim 1, further comprising a second storage element having one terminal connected to the other terminal of the first storage element, wherein:
 the first group of switches further includes a third MOSFET of the first conductivity type, which has a second main electrode connected to the other terminal of the second storage element and a first main electrode connected to the second voltage input terminal and which is turned ON/OFF based on voltage impressed on the first main electrode;
 the second group of switches further includes a fifth MOSFET of the second conductivity type, which has a second main electrode connected to the other terminal of the second storage element and a first main electrode connected to a third voltage output terminal held at ground potential and which is turned ON/OFF in correspondence with a signal inputted to a control electrode; and
 the third group of switches further includes a sixth MOSFET of the second conductivity type, which has a second main electrode connected to a control electrode of the third MOSFET of the first conductivity type and which is turned ON/OFF in correspondence with a signal inputted to a control electrode.

3. The voltage measurement device of claim 1, further comprising means for raising potential outputted from the first main electrode of the second MOSFET of the second conductivity type to the second voltage output terminal with respect to ground potential by constant voltage.

4. The voltage measurement device of claim 1, further comprising a current limit part for limiting currents flowing through the plural MOSFETs included in at least one of the first, second and third groups.

5. The voltage measurement device of claim 4, wherein the current limit part is formed by a resistant element and a voltage limiting element both inserted in series between the first main electrode and the control electrode of the first MOSFET of the first conductivity type and a resistant element and a voltage limiting element both inserted in series between the first main electrode and the control electrode of the second MOSFET of the first conductivity type, both of the first MOSFET and the second MOSFET being included in the first group of switches.

6. The voltage measurement device of claim 4, wherein the current limit part is formed by a resistant element connected to the first main electrode of the third MOSFET of the second conductivity type and a resistant element connected to the first main electrode of the fourth MOSFET of the second conductivity type, both of the third MOSFET and the fourth MOSFET being included in the third group of switches.

7. The voltage measurement device of claim 1, wherein the control means turns on the first groups of switches of the plural blocks simultaneously to allow the respective first storage elements corresponding to the respective blocks to hold end-to-end voltage thereof, and further turns on one or more second groups of switches in the second groups of switches of the plural blocks simultaneously while the first groups of switches of the plural blocks are turned off, thereby causing voltage held by one or more first storage elements corresponding to the one or more second groups of switches to be outputted from one or more voltage output terminals corresponding to the one or more second groups of switches.

8. The voltage measurement device of claim 1, wherein:
the control means turns on one or more first groups of switches in the first groups of switches of the plural blocks simultaneously to allow one or more first storage elements corresponding to one or more blocks to hold end-to-end voltage of the one or more blocks corresponding to the one or more first groups, and further turns on one or more second groups of switches corresponding to the one or more first groups of switches simultaneously while the one or more first groups of switches are turned off, thereby causing voltage held by the one or more first storage elements to be outputted from one or more voltage output terminals corresponding to the one or more second groups of switches.

9. The voltage measurement device of claim 1, wherein when the plural voltage sources are positive voltage, the first group of switches comprises Pch-MOSFETs, while the second group of switches and the third group of switches comprise Nch-MOSFETs.

10. The voltage measurement device of claim 1, wherein when the plural voltage sources are negative voltage, the first group of switches comprises Nch-MOSFETs, while the second group of switches and the third group of switches comprise Pch-MOSFETs.

11. The voltage measurement device of claim 1, further comprising a voltage limiting element arranged between the voltage output terminals and/or between the voltage output terminal and ground.

* * * * *